May 17, 1966 W. W. WHITE 3,252,109

CRYSTAL OSCILLATOR AND OVEN ASSEMBLY

Filed March 4, 1963

INVENTOR.
Winston Wayne White
BY
Mueller & Aichele
Attys.

United States Patent Office 3,252,109
Patented May 17, 1966

3,252,109
CRYSTAL OSCILLATOR AND OVEN ASSEMBLY
Winston W. White, Hillside, Ill., assignor to Motorola, Inc., Chicago, Ill., a corporation of Illinois
Filed Mar. 4, 1963, Ser. No. 262,534
6 Claims. (Cl. 331—69)

This invention relates generally to temperature stabilized crystal oscillator assemblies and the like, and more particularly to improved means for housing the crystal oven chamber and the electrical circuitry associated therewith.

It is common practice to use a crystal controlled oscillator to provide a stable frequency signal source for use in communication and related systems. For a high degree of frequency stability it is necessary to control the temperature of the crystal within close limits, notwithstanding wide ambient temperature variations. To this end, the crystal is enclosed in an oven chamber and a regulatable heater such as an electrical resistance heater and heat sensing means, maintained in close thermal proximity to the oven chamber, are coupled to a regulator circuit to control the power supplied to the heater to maintain a predetermined temperature within the oven chamber. In many systems it is desirable, if not necessary, that the oven chamber and related control circuitry be provided in a compact, self-contained unit in close association with the oscillator circuit with which the crystal is to be used. The oven chamber itself should be as small as possible and well insulated to minimize power consumption and should be mounted in such a manner that the crystal is free from mechanical vibration and shock under conditions of severe usage to prevent frequency shifts of the associated oscillator, which often operates at radio frequencies and higher. It is further convenient to provide an overall assembly in which the crystal can be readily changed and in which associated circuitry is easily made available for replacement and maintenance with a minimum amount of down time of the unit.

It is therefore an object of the present invention to provide an improved temperature control oven assembly for electronic circuit components such as piezoelectric crystals and the like.

Another object is to provide a compact, thermally efficient and readily accessible unit for housing an oven chamber for a piezoelectric crystal and associated oscillator and temperature control circuitry.

A further object is to provide a compact, temperature stable crystal oscillator unit of extreme mechanical rigidity and high thermal efficiency, which unit can be readily disassembled for crystal replacement and circuit maintenance.

A feature of the present invention is the provision of a compartmented housing unit with one compartment thereof containing an insulated chamber only large enough to enclose a piezoelectric crystal or similar electronic component, which compartment further contains a resistance heating element and a heat sensing device mounted in close thermal proximity to the chamber, and with another compartment thereof containing a crystal controlled oscillator as well as a control circuit responsive to the heat sensing element to control the current to the heating element to maintain the crystal at a constant temperature. The chamber, the heating element, and the heat sensing device are all supported in one compartment by cured foaming plastic material such as polyurethane foam to provide mechanical rigidity and thermal insulation, while the control circuit and the oscillator circuit associated with the crystal are transistorized and mounted on circuit boards secured in the other compartment.

Another feature is the provision of a compartmented housing unit with a removable closure portion and having an oven chamber mounted in thermal insulation in one compartment thereof, and circuit boards with a temperature control circuit and RF oscillator circuit thereon mounted in another compartment. The oven chamber and circuit boards are made readily accessible by removal of the closure portion of the housing unit for crystal replacement and circuit maintenance.

Further objects, features and the attending advantages of the invention will be apparent from the consideration of the following description when taken in conjunction with the accompanying drawings, in which.

Figures 1, 2, 3:
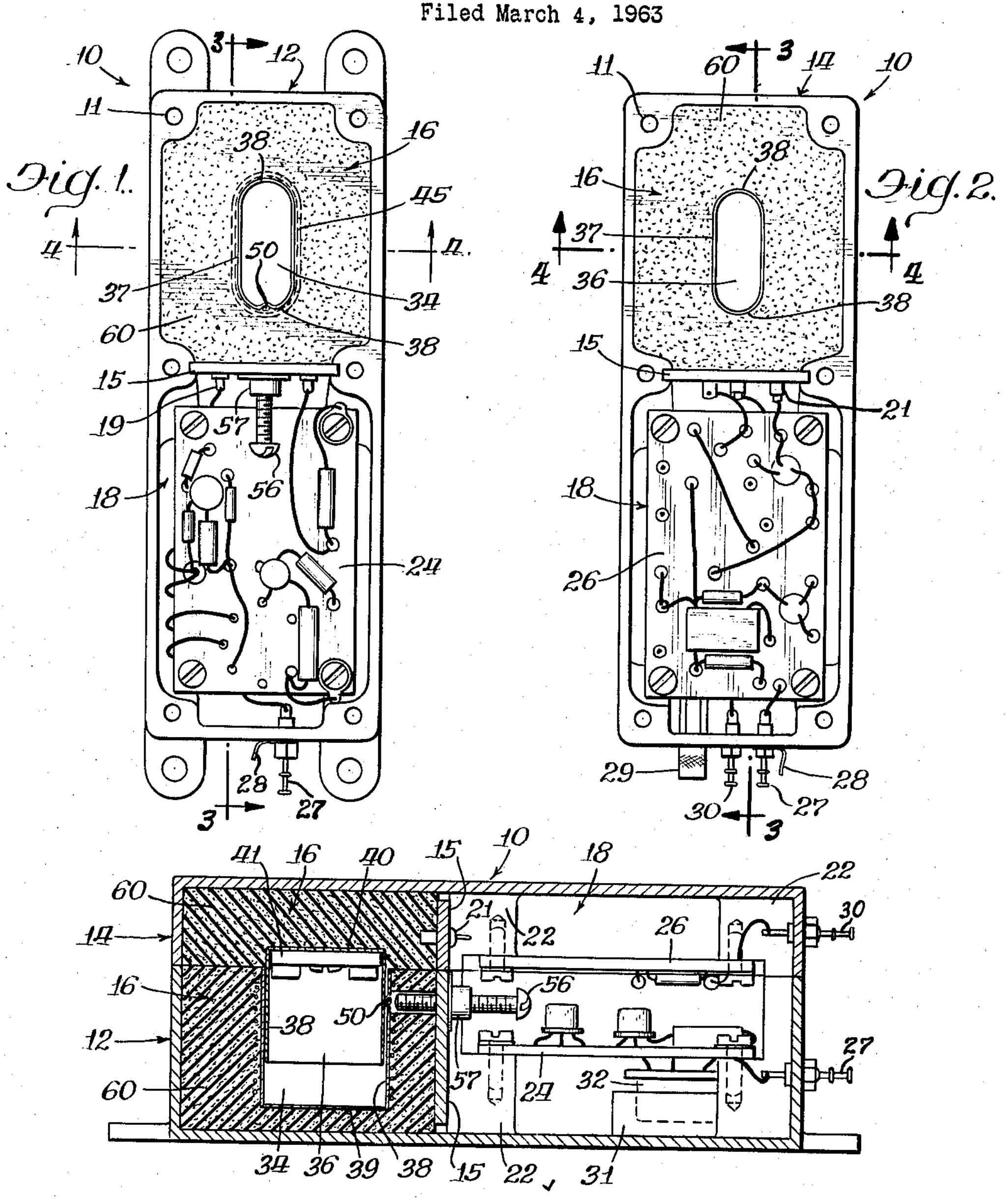
FIG. 1 is a plan view of a disassembled portion of the oven illustrating the internal construction thereof.
FIG. 2 is a plan view of a further disassembled portion of the oven illustrating the internal structure thereof.
Figure 4:
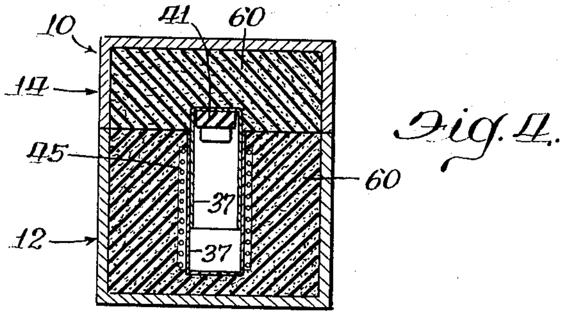

FIG. 3 is a cross-section of an assembled oven taken along lines 3—3 of FIGS. 1 and 2; and FIG. 4 is a further cross-section of an assembled oven taken along lines 4—4 of FIGS. 1 and 2.

In practicing the invention there is provided an enclosed compartmented housing having coaxially disposed cavities forming an oven chamber for containing a piezoelectric crystal or other electronic component which is to be maintained at a constant temperature centrally located in one compartment thereof. A transistorized control circuit and a transistorized RF oscillator are located in the other compartment thereof. A resistance wire heating element surrounds a portion of the oven chamber and a heat sensing device such as a negative coefficient thermistor is positioned in close proximity to the chamber. The compartmented housing is formed of separable portions so that each compartment is readily exposable for ease of crystal replacement and circuit maintenance.

By filling the compartment of the housing containing the oven chamber with a thermal insulating material such as polyurethane foam the oven chamber, the resistance heating element and the thermistor are supported in a manner which provides a compact, thermally efficient unit which is free from mechanical vibration. For a completed assembly the radio frequency oscillator associated with the crystal and the temperature control circuits are disposed on plated circuit boards secured to mounting studs provided in the other compartment, with a heat sink integral with the housing provided for the power transistor of the temperature control circuit. Circuit interconnections between the crystal, the thermistor, and the resistance heating element located in one compartment and the control circuit and the RF oscillator locator in the other compartment are provided by feedthrough terminals positioned in a bulkhead wall separating the two compartments. The closure portion of the compartmented housing is readily separable therefrom so that each compartment may be exposed for ease of crystal replacement and circuit maintenance.

Referring now specifically to the drawings, FIGS. 1–4 illustrate a preferred mechanical embodiment of the invention, wherein a piezoelectric crystal is maintained at a constant temperature for frequency stability of a crystal controlled radio frequency oscillator. Metallic housing 10 is comprised of separable units 12 and 14, which are shown in plan view in FIGS. 1 and 2 respectively, and in cross-section in assembled condition in FIGS. 3 and 4. Separable units 12 and 14 may conveniently be made of cast aluminum and are assembled by bolts extending through threaded holes 11. When the oven is in its assembled condition, partition walls 15 in each separable unit form compartments 16 and 18. Compartment 16 contains the oven chamber, the resistance heater and the temperature sensing element. Compartment 18 contains provision for mounting the temperature control circuit and the radio frequency oscillator. The temperature control circuit is of the proportional type, and preferably of the type utilizing a heat sensing element such as a thermistor as one arm of a bridge circuit, wherein bridge unbalance results in more current in the resistance heating element. The radio frequency oscillator may be any one of a number of known types of crystal controlled oscillators operating at a specified frequency and in circuit detail forms no part of the invention. A plurality of feedthrough terminals shown generally at 19 provide for electrical interconnections between the heater and the sensing element located in compartment 16 and the oven control circuit mounted in compartment 18. Similarly, electrical feedthroughs 21 provide for circuit interconnections between the crystal located in the oven chamber in compartment 16 and the radio frequency oscillator circuit located in compartment 18.

Compartment 18 contains plated, etched or eyeletted circuit boards 24 and 26, secured to mounting bosses 22 integrally cast with separable units 12 and 14, respectively. Circuit board 24 has disposed thereon the circuit elements for the oven control circuit while circuit board 26 has disposed thereon the circuit elements of the radio frequency oscillator. It is to be understood that the disposition of circuit elements shown are merely representative and do not illustrate all of the circuit components disposed on these two boards. Feedthrough terminals 27 and grounding lugs 28, located in one wall of each of separable units 12 and 14, are utilized to provide direct current operating voltages for the circuit on circuit boards 24 and 26. Tuning of oscillator 26 is accomplished by mechanical adjustment of a slug tuned inductor accessible when protective cap 29 is removed, and RF output is provided at feedthrough terminal 30. Alternately miniature coaxial connectors may be used in place of terminals 27, 28 and 30. Shoulder portion 31 in the bottom of compartment 18 provides a heat sink for the mounting of a power transistor such as the one shown at 32 which may be used to control the current supplied to the resistive heating element for the oven chamber by the temperature control circuit located on circuit board 24.

The oven chamber containing the circuit element which is to be maintained at a constant temperature is comprised of two metallic cup-shaped cavities 34 and 36, formed from a thermally conductive metal such as copper. As best seen in FIGS. 1 and 2, cavities 34 and 36 have in cross-section two generally flat vertically extending side walls 37 joined by radiused end portions 38. As can be seen from FIG. 3, when the separable units 12 and 14 are assembled, cavity 36 extends coaxially into cavity 34 to form the oven chamber. Bottom portion 39, contiguous with the side walls of cavity 34, encloses the bottom thereof while bottom portion 40 of cavity 36 includes a plurality of apertures, not shown, for mounting socket 41 for the crystal and for allowing electrical leads to extend therethrough for connection by feedthrough bushings 21 to the RF oscillator on circuit board 26. By way of example, the crystal may be of the plug-in type designated as HC–6/U, with corresponding holder.

As best seen in FIG. 4, a heater winding 45 of resistance wire such as No. 32 Cupron or Nichrome is wound longitudinally about the exterior of the walls of cavity 34. This is preferably a single winding having the ends thereof connected to feedthrough terminals 19 to receive energization current from the temperature control circuit located on insulating board 24 and having a tap point also for connection to the temperature control circuit. By way of example, the heater winding may be disposed over a thin electrical insulating layer on the external surfaces of cavity 34 and mechanically secured thereon by a coating of silicon varnish.

The temperature within oven chamber 34 is sensed by a bead thermistor 50 located in an indentation in radiused end portion 38 of cavity 34. This thermistor consists of a small bead of semiconductor material placed between two wires, and typically has a diameter in the order of 0.05 centimeters. Thermistors of this type have a relatively high negative temperature coefficient of resistivity. The leads of thermistor 50, not shown, are connected to further feedthrough terminals 19 for connection on one arm of the bridge of the temperature control circuit on circuit board 24. It is to be noted that cavities 34 and 36 are provided with a clearance between their respective end portions 38 to allow for the indentation containing thermistor 50 and to further allow for ease of assembly of separable units 12 and 14, while side walls 37 of the two cavities are provided with a tight fit for good heat transfer.

An adjustable screw 56 extends through internally threaded bushing 57 in partition wall 15 so that one end thereof is in close proximity to bead thermistor 50. As is best seen in FIG. 3, screw 56 provides a heat conducting mass in thermal contact with partition wall 15 and hence the external walls of housing unit 10 so that screw 56 is substantially at ambient temperature. By adjusting the proximity of screw 56 to bead thermistor 50 it is possible to provide a variable heat loss path between the thermistor and ambient temperature. This allows the heat loss from heater winding 45 and the heat loss from thermistor 50 to be conducted through balanced heat loss paths so that the oven temperature may be maintained constant by the control circuit independent of outside ambient temperature variations.

Cavity 34, heater winding 45 and thermistor 50 are potted in a compartment 16 of separable housing unit 12 by a cured foaming plastic material 60 such as polyurethane foam. In a like manner the bottom portion of cavity 36 is supported in compartment 16 of separable housing unit 14. The polyurethane foam provides mechanical rigidity for the oven chamber and at the same time has excellent thermal insulating properties so that the oven is highly efficient to keep power consumption from the oven control circuit at a minimum. A suitable foaming material is supplied by Nopco Company under the designation of B–610. A predetermined amount of the material, by weight, is placed in compartment 16 of separable units 12 and 14 and a catalyst is added to commence the foaming action. A cover plate having jigging means to hold the cavities in place is secured over the compartments to restrict the foam within the desired confines of the compartment. Typically the volume within the compartment is filled in a period of approximately two minutes, and the density of the resulting insulation is determined by the weight of the polyurethane used prior to foaming. By way of example, for the above identified material 10 pounds per cubic foot of volume results in a cured insulated foam which has excellent mechanical and thermal properties. Subsequent to the initial two minute foaming period the unit is held at elevated temperatures (approximately 120° C.) for a period of about one-half hour for curing and is then lowered to the temperature of Dry Ice for a short time to insure that all foaming action has stopped.

The invention provides therefore a compact and highly efficient electrically heated oven assembly to maintain an electrical component such as a piezoelectric crystal at a constant temperature. A compartmented housing has one compartment for containing the oven chamber, heating element, and heat sensing element, and another compartment for containing the associated temperature control circuit and radio frequency oscillator. The crystal is enclosed in an oven chamber only large enough for the element itself, which chamber is encapsulated in a cured foaming plastic material to provide mechanical rigidity and thermal insulation. The associated control circuit and radio frequency oscillator are mounted on circuit boards, and the housing is provided with a closure portion which is readily separable therefrom for ease of disassembly for crystal replacement and circuit maintenance.

I claim:

1. In an oven assembly for a crystal controlled oscillator the combination including a metallic outer housing having a base unit and a removable closure unit, said base unit and said closure unit including partition means cooperating with each other to provide first and second compartments in said housing when in assembled condition, a first thin walled metallic cup centrally positioned in said first compartment, thermal insulating means supporting said first cup in said base unit to form a cavity therein with an opening facing said closure unit, a second thin wall metallic cup having extending wall portions with an opening therein adapted to fit coaxially within said first cup to form an oven chamber, thermal insulating means supporting said second cup in said closure unit, resistance heating means supported by and in thermal contact with the exterior surface of said first cup, heat sensing means supported in thermal contact with the exterior surface of said first cup, a temperature control circuit mounted in said second compartment, and means mounted in said partition means for providing electrical connections between said resistance heating means and said heat sensing means and said temperature control circuit.

2. A temperature stabilized crystal controlled oscillator assembly including in combination, a generally rectangular outer housing, partition means dividing said housing into first and second compartments, means forming a metallic oven chamber defining a cavity and including socket means for mounting a piezoelectric crystal, a heating coil supported by said oven chamber and in thermal contact therewith, heat sensing means in thermal contact with said oven chamber, heat conducting means supported on said partition means and adjustably positioned with respect to said heat sensing means, thermal insulating material supporting said oven chamber in heat isolation relationship in a central portion of said first compartment, first and second plated circuit boards, means integral with said outer housing for supporting said first and second circuit boards in said second compartment, said first circuit board having a temperature control circuit mounted thereon and said second board having an oscillator circuit mounted thereon, and a plurality of feedthrough terminals mounted in said partition means providing for electrical interconnections between said socket means and said oscillator circuit and between said heating coil and said heat sensing means and said temperature control circuit.

3. A temperature stabilized crystal controlled oscillator assembly including in combination, a metallic outer housing having a base unit and a removable closure unit, said base unit and said closure unit including cooperating with each other for partition means dividing said housing to provide first and second compartments in said housing when in an assembled condition, a first metallic cup centrally positioned in said first compartment, thermal insulating material supporting said first metallic cup in said base unit to form a cavity therein having an opening facing said closure unit, a second metallic cup having extending wall portions with an opening therein adapted to fit coaxially within said first cup to form an oven chamber, thermal insulating material supporting said second cup in said closure unit, socket means in said oven chamber for mounting a piezoelectric crystal, resistance heating means supported in thermal contact with the exterior surface of said first cup, thermistor means supported in a recess in the exterior surface of said first cup, a temperature control circuit board supported on said base unit in said second compartment, a radio frequency oscillator circuit board supported on said closure unit in said second compartment, and a plurality of feedthrough terminals mounted in said partition means providing for electrical interconnections between said socket means and said oscillator circuit board and between said resistance heating means and said thermistor and said temperature control circuit board.

4. Electrical apparatus including in combination, a metallic outer housing having a body portion and a removable closure portion, said portions including partition means cooperating with each other for dividing said housing into first and second compartments, a first metallic cup centrally positioned in said first compartment, thermal insulating material supporting said first cup in said body portion to form a cavity therein having an opening facing said closure portion, a second metallic cup having extending wall portions forming an opening adapted to fit coaxially within said first cup to form an oven chamber, thermal insulating means supporting said second cup in said closure portion, socket means in said oven chamber for mounting a piezoelectric crystal, resistance heating means supported in thermal contact with the exterior surface of said first cup, thermistor means in thermal contact with the exterior surface of said first cup, heat conducting means supported on said partition means of said body portion and adjustably positioned with respect to said thermistor means, first and second plated circuit boards, means for supporting said first circuit board in said second compartment on said body portion, means for supporting said second circuit board in said second compartment on said closure portion, said first circuit board having a temperature control circuit mounted thereon and said second circuit board having an oscillator circuit mounted thereon, a plurality of feedthrough terminals mounted in said partition means of said body portion for providing electrical interconnections between said resistance heating means and said thermistor means and said temperature control circuit, and a plurality of feedthrough terminals mounted in said partition means of said closure portion for providing electrical interconnections between said socket means and said oscillator circuit.

5. An oven assembly including in combination, a metallic outer housing having a base unit and a removable closure unit, said base unit and said closure unit including partition means cooperating with each other to provide first and second compartments in said housing when in assembled condition, a first thin-walled metallic cup centrally positioned in said first compartment, thermal insulating means supporting said first cup in said base unit to form a cavity therein with an opening facing said closure unit, a second thin-walled metallic cup having extending wall portions with an opening therein adapted to fit coaxially within said first cup to form an oven chamber, thermal insulating means supporting said second cup in said closure unit, heating means in said first compartment including a heating coil in thermal contact with the exterior surface of said first cup, heat sensing means supported in thermal contact with the exterior surface of said first cup, temperature control circuit means mounted in said second compartment, and connector means mounted in said partition means for providing electrical connections between said heating means and said heat sensing means in said first compartment and said temperature control circuit in said second compartment.

6. A temperature stabilized crystal controlled oscillator assembly including in combination, a metallic outer housing having a base unit and a removable closure unit, said base unit and said closure unit including partition means cooperating with each other for dividing said housing to provide first and second compartments in said housing when in an assembled condition, a first metallic cup centrally positioned in said first compartment, thermal insulating material supporting said first metallic cup in said base unit to form a cavity therein having an opening facing said closure unit, a second metallic cup having extending wall portions with an opening therein adapted to fit within said first cup to form an oven chamber, thermal insulating material supporting said second cup in said closure unit, socket means in said oven chamber for mounting a piezoelectric crystal, heating means in said first compartment including a heating coil supported in thermal contact with the exterior surface of said first cup, thermistor means supported on the exterior surface of said first cup, heat conducting means supported on said partition means of said base unit and extending into said first and second compartments and adjustably positioned with respect to said thermistor means, a temperature control circuit board supported on said base unit in said second compartment, a radio frequency oscillator circuit board supported on said closure unit in said second compartment, and a plurality of feedthrough terminals mounted in said partition means and providing for electrical interconnections between said socket means in said first compartment and said oscillator circuit board in said second compartment and between said heating means and said thermistor in said first compartment and said temperature control circuit board in said second compartment.

References Cited by the Examiner

UNITED STATES PATENTS

| | | | |
|---|---|---|---|
| 2,073,459 | 3/1937 | Thurston | 310—8.9 X |
| 2,938,099 | 5/1960 | Cheli | 219—19 |
| 3,007,023 | 10/1961 | Johnston et al. | 219—19 |
| 3,152,304 | 10/1964 | Ringer et al. | 331—69 X |
| 3,158,821 | 11/1964 | Sulzer | 331—69 |

NATHAN KAUFMAN, *Primary Examiner.*

JOHN KOMINSKI, ROY LAKE, *Examiners.*